(12) United States Patent
Chang et al.

(10) Patent No.: US 10,825,818 B2
(45) Date of Patent: Nov. 3, 2020

(54) METHOD OF FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/211,239

(22) Filed: Dec. 6, 2018

(65) Prior Publication Data

US 2019/0109138 A1    Apr. 11, 2019

Related U.S. Application Data

(62) Division of application No. 15/884,415, filed on Jan. 31, 2018, now Pat. No. 10,186,513.

(30) Foreign Application Priority Data

Feb. 3, 2017    (CN) .......................... 2017 1 0063719

(51) Int. Cl.
*H01L 27/108* (2006.01)
*H01L 21/768* (2006.01)

(52) U.S. Cl.
CPC .. *H01L 27/10885* (2013.01); *H01L 21/76802* (2013.01); *H01L 21/76877* (2013.01); *H01L 27/10814* (2013.01); *H01L 27/10823* (2013.01); *H01L 27/10888* (2013.01); *H01L 27/10894* (2013.01); *H01L 27/10897* (2013.01); *H01L 21/7682* (2013.01); *H01L 21/76897* (2013.01)

(58) Field of Classification Search
CPC ......... H01L 27/10876; H01L 27/10823; H01L 27/10885; H01L 27/10888; H01L 27/10894; H01L 21/76897; H01L 21/76877; H01L 21/76802; H01L 21/7682
USPC ....................................................... 257/296
See application file for complete search history.

(56) References Cited

U.S. PATENT DOCUMENTS

| | | | |
|---|---|---|---|
| 9,379,004 B1 | 6/2016 | Kwon et al. |
| 9,391,138 B2 | 7/2016 | Kim et al. |
| 9,431,324 B2 | 8/2016 | Shin |
| 9,466,603 B2 | 10/2016 | Yeom et al. |
| 9,530,851 B1 | 12/2016 | Lu |
| 2015/0340281 A1 | 11/2015 | Lee |

(Continued)

*Primary Examiner* — Theresa T Doan
(74) *Attorney, Agent, or Firm* — Winston Hsu (57) ABSTRACT

A semiconductor device and method of forming the same, the semiconductor device includes bit lines, a transistor, a dielectric layer, plugs and a capping layer. The bit lines are disposed on a substrate within a cell region thereof, and the transistor is disposed on the substrate within a periphery region. The plugs are disposed in the dielectric layer, within the cell region and the periphery region respectively. The capping layer is disposed on the dielectric layer, and the capping layer disposed within the periphery region is between those plugs. That is, a portion of the dielectric layer is therefore between the capping layer and the transistor.

9 Claims, 9 Drawing Sheets

(56) References Cited

U.S. PATENT DOCUMENTS

2016/0181143 A1* 6/2016 Kwon ................. H01L 27/1052
  438/586
2016/0268203 A1 9/2016 Lu
2016/0307906 A1 10/2016 Kim
2017/0062347 A1 3/2017 Kim

* cited by examiner

METHOD OF FORMING SEMICONDUCTOR DEVICE

CROSS REFERENCE TO RELATED APPLICATIONS

This application is a Divisional of application Ser. No. 15/884,415 filed Jan. 31, 2018, and included herein by reference.

BACKGROUND OF THE INVENTION

1. Field of the Invention

The present invention generally relates to the field of semiconductor devices and forming method thereof, and more particularly to a dynamic random access memory (DRAM) device and a forming method thereof.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. For example, the reduced line-width also increases the line resistance (R). Furthermore, the shrunk spaces between wires also increase the parasitic capacitance (C), so that, the RC delay is therefore increase to achieve poor efficiency. Therefore, there is still a need to provide an improved memory cell with a buried gate to gain enhanced performance and reliability of the corresponding memory device.

SUMMARY OF THE INVENTION

One object of the present invention is to provide a method of forming a semiconductor device, in which, an air-gap layer is formed between each bit line and each storage node contact (SNC). That is, the low resistant air-gap layer is able to improve the aforementioned RC delay issues under a simplified process flow.

One object of the present invention is to provide a semiconductor memory device, in which, an air-gap layer is disposed between each bit line and each SNC, so as to improve the RC delay issues.

To achieve the purpose described above, the present invention provides a method of forming a semiconductor device, including the following steps. First of all, a substrate having a cell region and a periphery region is provided, and a plurality of bit lines is formed on the substrate within the cell region, with a composite spacer having a middle silicon layer being formed at two sides of each bit line. Next, at least one gate structure is formed on the substrate within the periphery region. Then, a dielectric layer is formed to cover the cell region and the periphery region, and a plurality of plugs is formed in the dielectric layer, within the cell region and the periphery region. Following these, the middle silicon layer of each composite spacer is removed, to form an air-gap layer, and a capping layer is formed to cover the air-gap layer and the dielectric layer.

To achieve the purpose described above, the present invention provides a semiconductor device including a substrate, a plurality of bit lines, at least one transistor, a dielectric layer and a plurality of plugs. The substrate comprises a cell region and a periphery region, and the bit lines are parallel disposed on the substrate within cell region, with a composite spacer being disposed at two sides of each bit line and comprising a first layer, an air-gap layer and a third layer. The transistor is disposed on the substrate within the periphery region, and the dielectric is disposed on the substrate and covers the bit lines and the transistor. The plugs are disposed in the dielectric layer, and which comprises first plugs disposed within the cell region and second plugs disposed within the periphery region. The capping layer is disposed on the dielectric layer, wherein the capping disposed within the periphery region is between the second plugs and a portion of the dielectric layer being between the capping layer and the transistor.

Overall, the semiconductor device of the present invention is characterized by forming an air-gap layer after the formations of the SNCs and the conductive pads by directly using formed conductive pad as an etching mask. Also, since the air-gap layer is formed through removing the only silicon-containing middle layer within the composite spacer, the formation of the air-gap layer is therefore achieved in a simplified process flow without affecting other elements within other regions. Thus, the semiconductor device obtained in said forming method of the present invention not only can gain cost down, but also can achieve better performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating a method of forming a semiconductor device according to a preferred embodiment of the present invention, in which:

DETAILED DESCRIPTION

To provide a better understanding of the present invention, preferred embodiments will be described in detail. The preferred embodiments of the present invention are illustrated in the accompanying drawings with numbered elements.

Referring to FIGS. 1-9, FIGS. 1-9 illustrate a forming method of semiconductor device according to a preferred embodiment of the present invention. In the present embodiment, a forming method of a semiconductor memory device such as a dynamic random access memory (DRAM) device, is provided, and the semiconductor memory device at least includes at least one transistor structure (not shown in the drawings) and at least one capacitor structure (not shown in the drawings), thereto serve as the smallest unit in the DRAM array for accepting signals from bit lines 160 and word lines (not shown in the drawings) during the operation.

The semiconductor memory device includes a substrate 100, such as a silicon substrate, a silicon containing substrate like SiC or SiGe, or a silicon on insulator (SOI) substrate, and a cell region 101 and a periphery region 102 are defined on the substrate 100. In the present embodiment, a shallow trench isolation (STI) 110 is further formed in the substrate 100 both within the cell region 101 and the periphery region 102 to define a plurality of active areas (AAs). The formation of the STI 110 is but not limited to be accomplished by performing an etching process to form a plurality of trenches (not shown in the drawings) in the substrate 100, followed by filling an insulating material such as silicon oxide or silicon nitride in the trenches.

Also, a plurality of buried gates (not shown in the drawings) are formed in the substrate 100 within the cell region 101, and those buried gates are parallel extended along a direction (not shown in the drawings) to cross the AAs. That is, those buried gates are able to function like buried word lines (BWLs) of the semiconductor memory device. Additionally, a plurality of bit lines 160 are formed on the substrate 100, within the cell region 101, and which are parallel extended along a direction D which is perpendicular to the extended direction of the BWLs, to simultaneously cross the AAs and BWLs in the substrate 100. In one embodiment, each of the bit lines 160 for example includes a semiconductor layer 161, a barrier layer 163, a metal layer 165 and a mask layer 167 stacked one over another on the substrate 100. Moreover, a portion of the bit lines 160 further includes a bit line contact (BLC) 160a disposed underneath, and the bit line contacts 160a and the semiconductor layer 161 of bit lines 160 are actually monolithic, as shown in FIG. 1.

Figure 1:
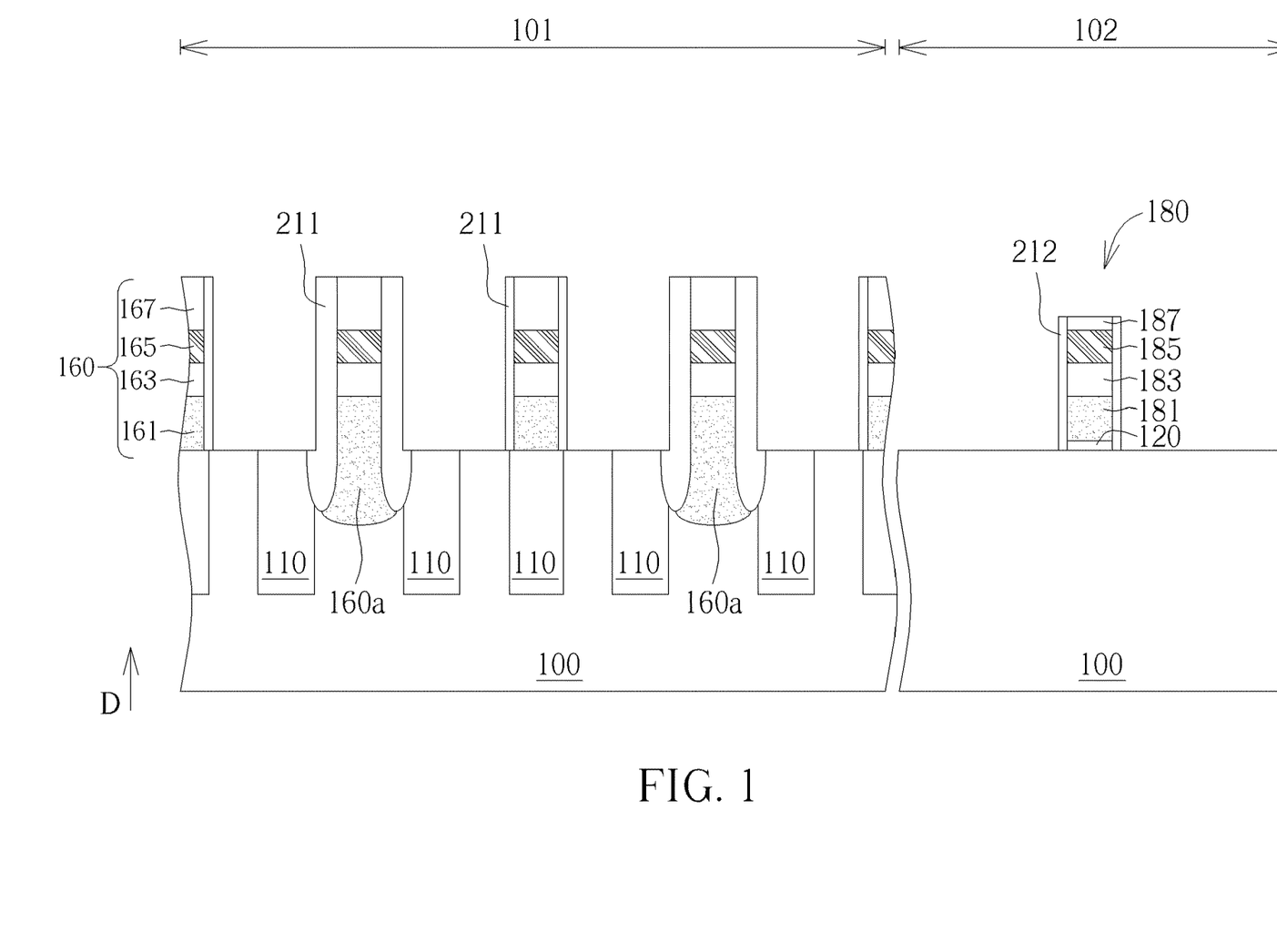
FIG. 1 shows a cross-sectional view of a semiconductor device at the beginning of the forming process.

On the other hand, at least one gate structure 180 is formed on the substrate 100 within the periphery region 102, and the gate structure 180 for example includes a gate dielectric layer 120, a gate layer 181, a barrier layer 183, a metal layer 185 and a mask layer 187 stacked one over another on the substrate 100 as shown in FIG. 1. In one embodiment, the gate layer 181 of the gate structure 180 and the semiconductor layer 161 of the bit lines 160 are simultaneously formed, so that, the gate layer 181 of the gate structure 180 and the semiconductor layer 161 of the bit lines 160 both include polysilicon or amorphous silicon. Likewise, the barrier layer 183 of the gate structure 180 and the barrier layer 163 of the bit lines 160 are simultaneously formed, so that, the barrier layer 183 of the gate structure 180 and the barrier layer 163 of the bit lines 160 both include titanium (Ti) or titanium nitride (TiN); the metal layer 185 of the gate structure 180 and the metal layer 165 of the bit lines 160 are simultaneously formed, so that, the metal layer 185 of the gate structure 180 and the metal layer 165 of the bit lines 160 both include a low resistant metal such as tungsten (W), aluminum (Al) or copper (Cu); and the mask layer 187 of the gate structure 180 and the mask layer 167 of the bit lines 160 are simultaneously formed, so that, the mask layer 187 of the gate structure 180 and the mask layer 167 of the bit lines 160 both include silicon oxide, silicon nitride or silicon carbonitride (SiCN). In this way, the formation of the bit lines 160 and the formation of the gate structure 180 are integrated thereby.

Then, first layers 211, 212 of spacer surrounded each bit line 160 and the gate structure 180 are formed. It is noted that, the first layer 211 of spacer disposed at two sides of each bit lines 160 and the first layer 212 of spacer disposed at two sides of the gate structure 180 are respectively formed through different deposition processes and etching processes, so that, the first layers 211, 212 of spacer may include different materials. For example, the formation of the first layer 212 of spacer is firstly performed with the first layer 212 of spacer including silicon oxide or silicon oxynitride (SiON), and then, the formation of the first layer 211 of spacer is performed with the first layer 211 of spacer including silicon nitride, but is not limited thereto. Furthermore, while performing an etching back process to form the first layer 212 of spacer, a portion of the mask layer 187 is simultaneously removed, so as to make the entire gate structure 180 to have a lower height than that of each bit line 160, as shown in FIG. 1. After that, two source/drain regions (not shown in the drawings) are formed at two sides of the gate structure 180 in the substrate 100, to form a transistor (not shown in the drawings).

Figure 2:
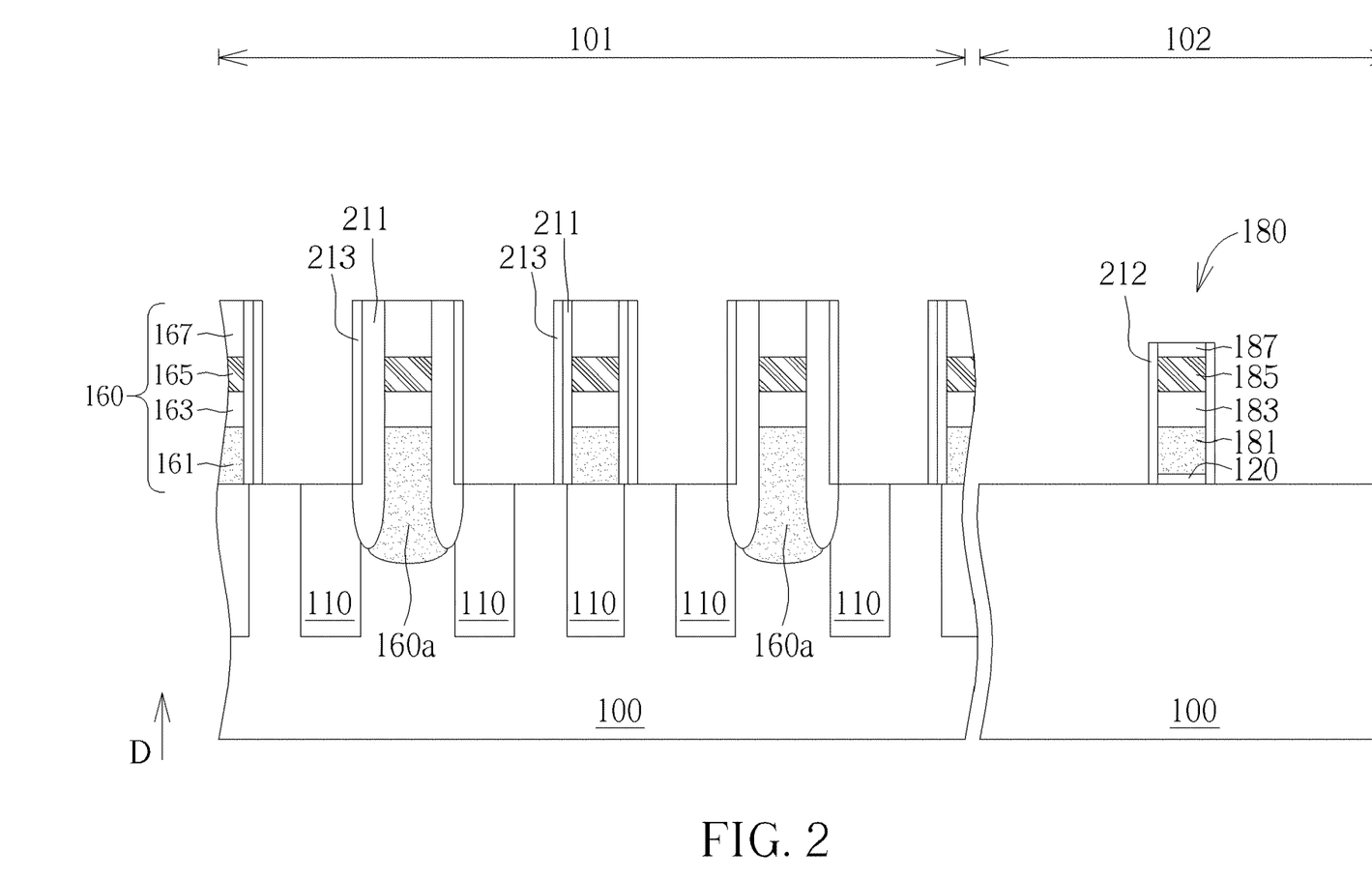
FIG. 2 shows a cross-sectional view of a semiconductor device after forming a spacer.

Next, a second layer 213 of spacer surrounded each bit line 160 is formed on the first layer 211 of spacer, as shown in FIG. 2. The formation of the second layer 213 of spacer is accomplished for example by first forming a material layer (not shown in the drawings) on the substrate 100 to cover the bit lines 160 within the cell region 101 and the gate structure 180 within the periphery region 102 at the same time, forming a mask (not shown in the drawings) only covered on the cell region, and performing an etching process through the mask, to completely remove the material layer covered on the gate structure 180. Next, after removing the mask, an etching back process is performed, to form the second layer 213 of spacer disposed at two sides of each bit lines, on the first layer 211 of spacer. In one embodiment, the material layer preferably includes a material having a great etching selectivity related to that of the first layer 211 of spacer, such as amorphous silicon. That is, the aforementioned etching back process is allowable to be performed without disposing any mask, to form the second layer 213 of spacer within the cell region 101.

Figure 3:
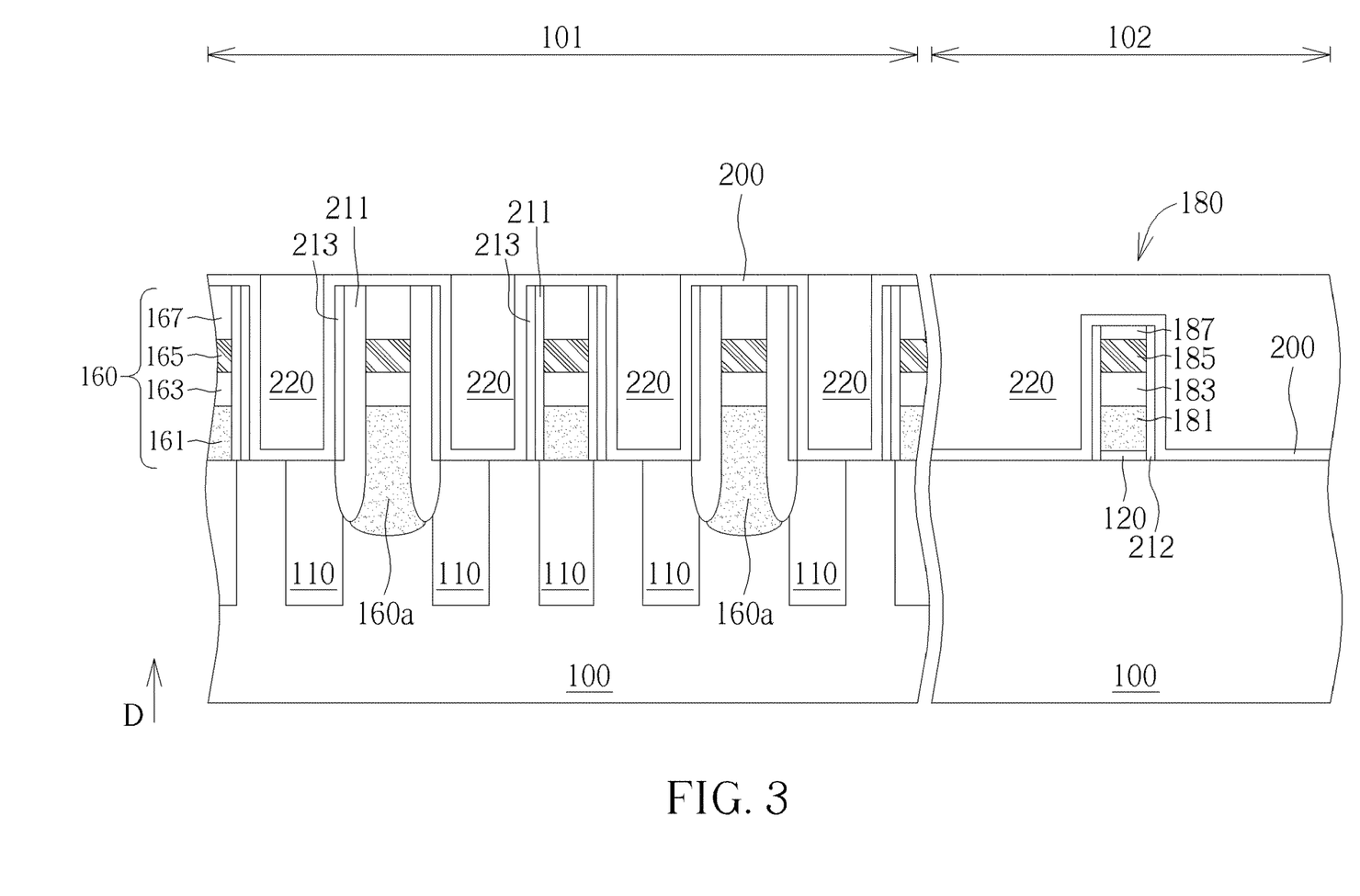
FIG. 3 shows a cross-sectional view of a semiconductor device after forming a dielectric layer.

Then, a spacer material layer 200 and an interlayer dielectric layer (ILD) 220 are sequentially formed on the substrate 100, as shown in FIG. 3. The spacer material layer 200 is conformally covered on the bit lines 160, and the first layer 211 and the second layer 213 of spacer, within the cell region 101, and the gate structure 180 within the periphery region 102. The spacer material layer 200 for example includes a material having a great etching selectivity related to that of the second layer 213 of spacer, such as silicon nitride or other materials the same as that of the first layer 211 of spacer, but not limited thereto. The ILD 220 includes a material having a great etching selectivity related to the spacer material layer 200, such as a material having a lower dielectric constant like silicon oxide. In one embodiment, the formation of ILD 220 is accomplished by first forming a dielectric layer (not shown in the drawings) covered on the bit lines 160 and the gate structure 180 to further fill in the spaces between the bit lines 160, followed by performing a planarization process like a chemical-mechanical polishing (CMP) process on the dielectric layer, to obtain the ILD 220 with a planar top surface. It is noted that, the ILD 220 disposed within the cell region 101 has a top surface which is leveled with the spacer material layer 200 disposed on the top surface of each bit lines 160, and the ILD 220 disposed within the periphery region 102 has a top surface high than the top surface of the gate structure 180. In other words, the ILD 220 only covers the sidewalls of the bit lines 160 instead of their top surfaces, and the ILD 220 completely covers the gate structure 180, as shown in FIG. 3.

Figure 4:
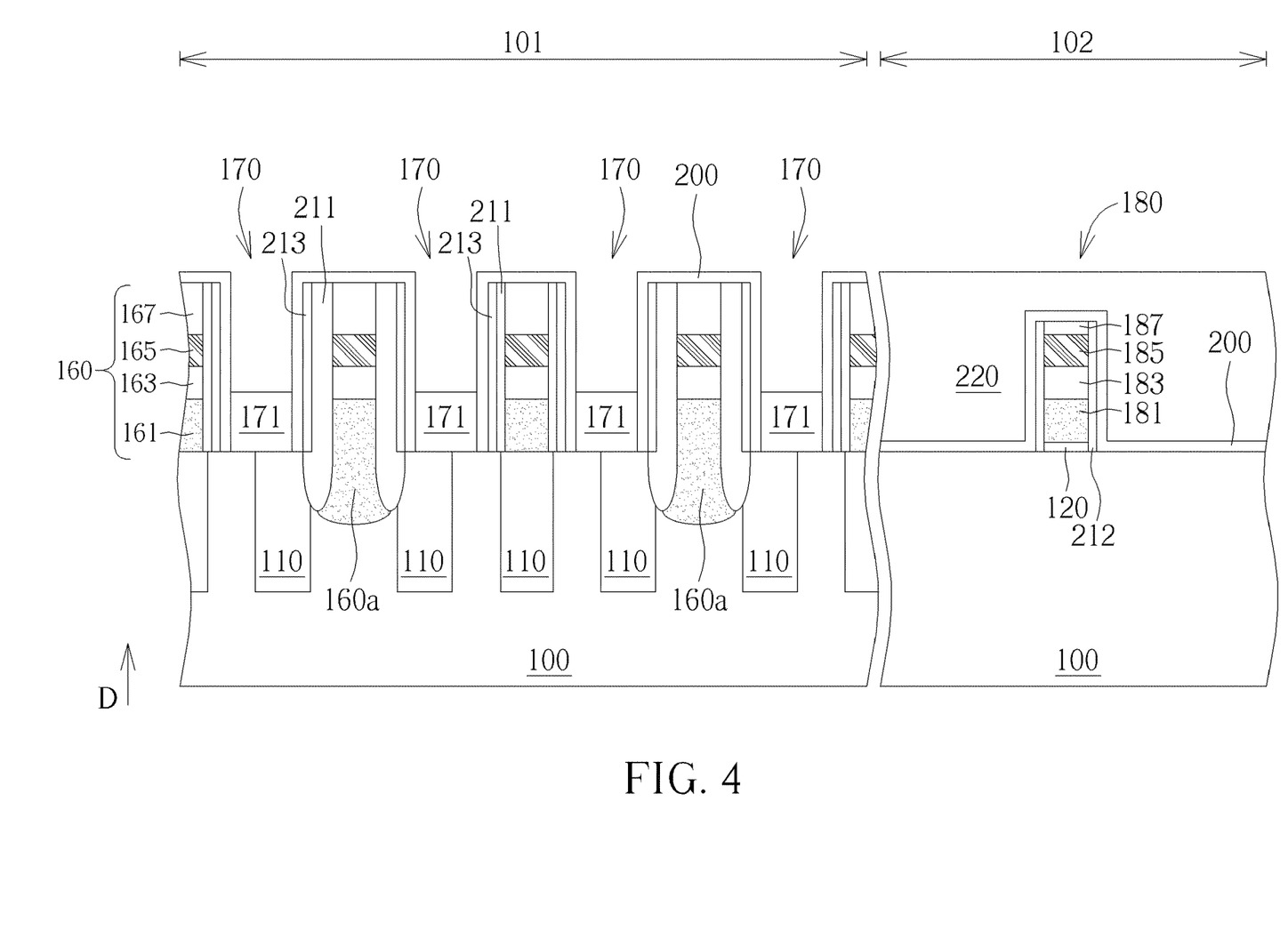
FIG. 4 shows a cross-sectional view of a semiconductor device after forming a trench.
Figure 5:
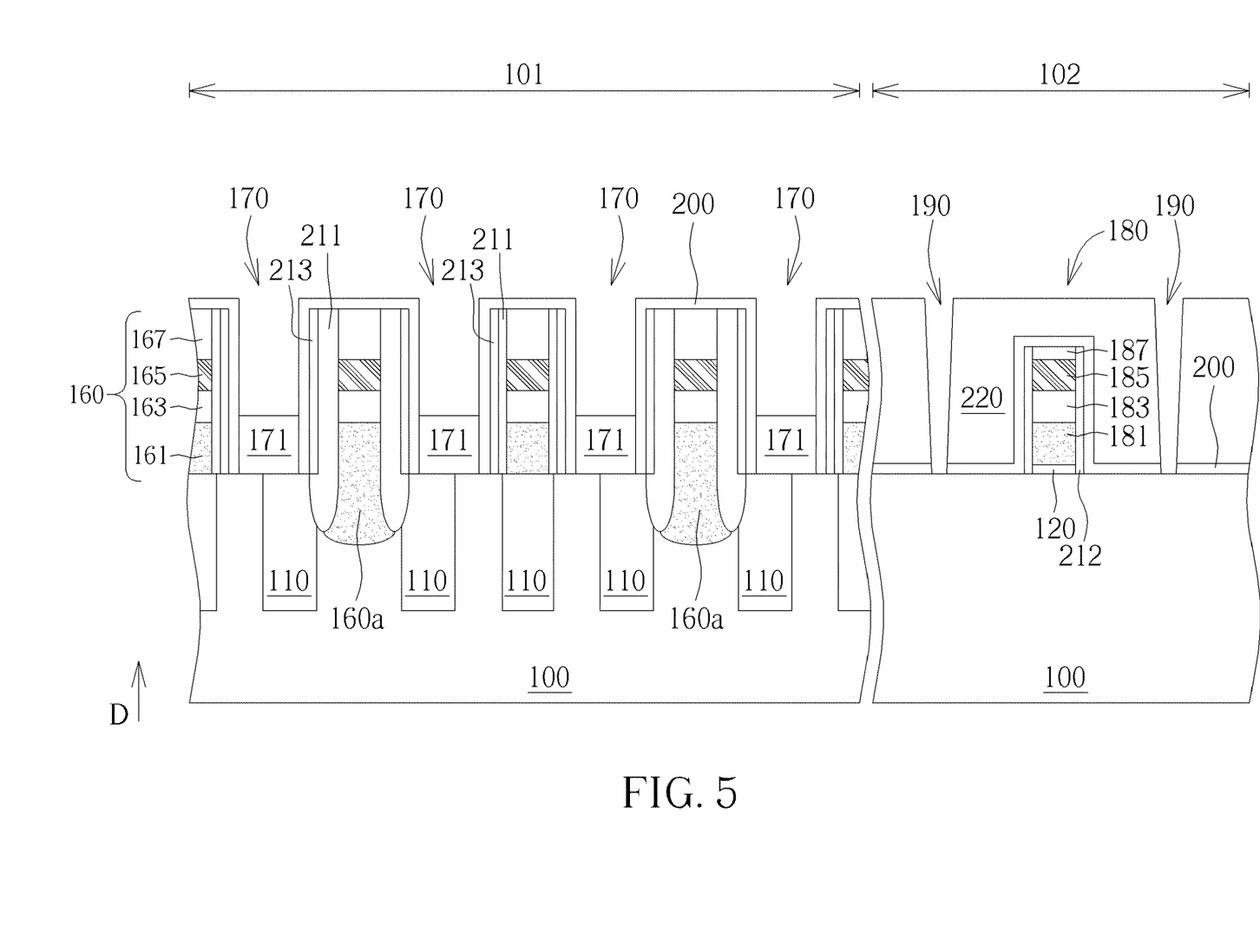
FIG. 5 shows a cross-sectional view of a semiconductor device after forming another trench.

As shown in FIGS. 4-5, trenches 170, 190 are sequentially formed within the cell region 101 and the periphery region 102. Firstly, a self-aligned double patterning lithography (SADP) process is performed to form a plurality of trenches 170 in the ILD 220 within the cell region 101. In the present embodiment, an etching process is performed to remove the ILD 220 disposed between each bit line 160, as well as the spacer material layer 200 underneath, so as to expose the substrate 100 and the STI 110 between each bit line 160, as shown in FIG. 4. Then, a conductive layer 171 such as a silicide layer or a silicon layer is formed in each trench 170 to directly in contact with the exposed substrate 100 and/or the exposed STI 110.

A patterned mask layer (not shown in the drawings) is then formed to cover the entire cell region 101 and a portion of the periphery region 102, followed by performing an etching process such as a dry etching process through the patterned mask layer, to form a plurality of trenches 190 in the periphery region 102, as shown in FIG. 5. The trenches 190 are formed by penetrating through the ILD 220 and the spacer material layer 200, so as to directly in contact with the source/drain regions at the two sides of the gate structure 180. After that, the patterned mask layer is removed completely.

Figure 6:
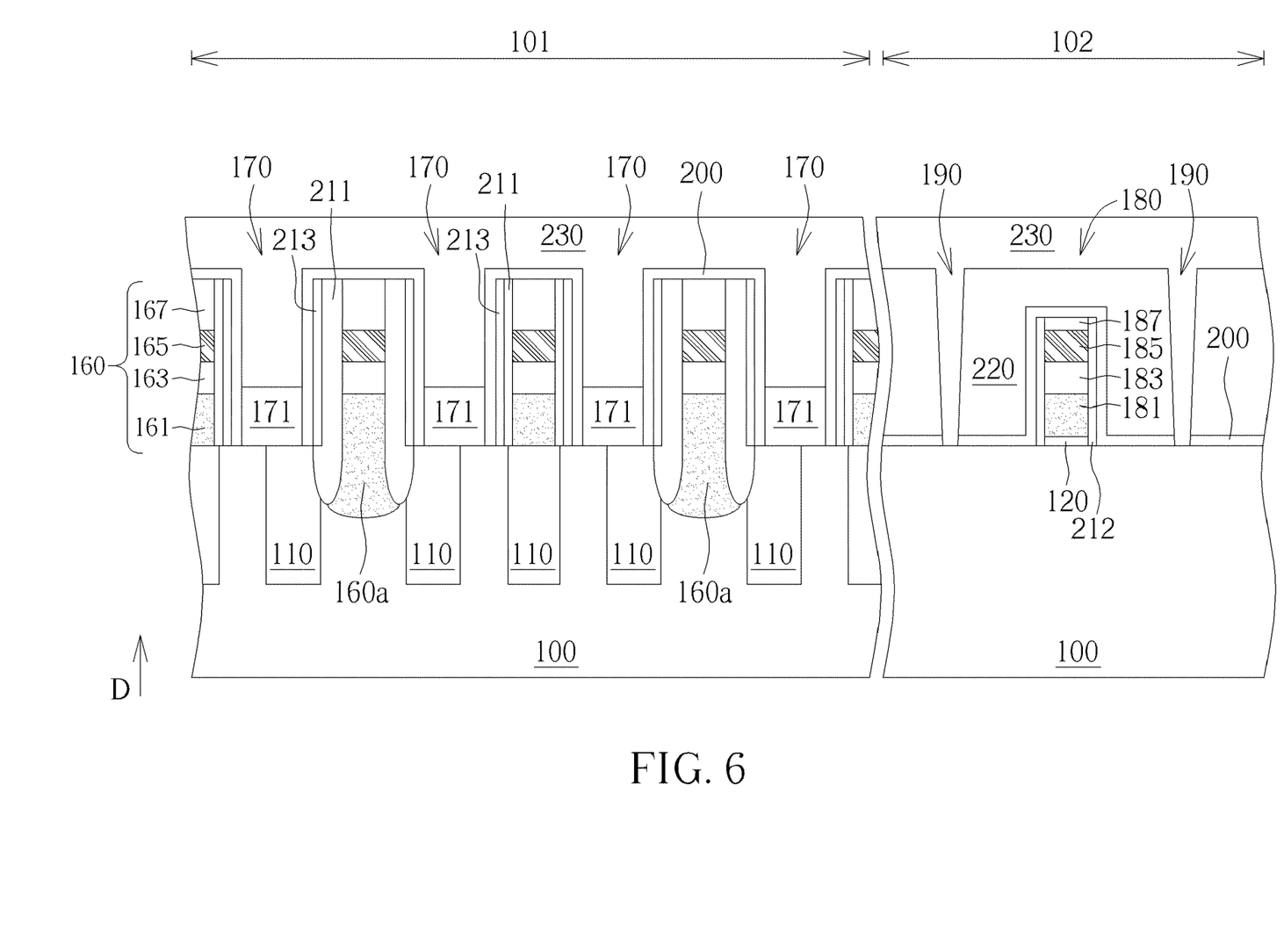
FIG. 6 shows a cross-sectional view of a semiconductor device after forming a metal conductive layer.

As shown in FIG. 6, a metal conductive layer 230 is then formed on the substrate 100, and which includes for example a barrier (including Ti/TiN for example, not shown in the drawing) and a low resistant metal like tungsten, but not limited thereto. In the present embodiment, the metal conductive layer 230 fills the trenches 170 within the cell region 101 and the trenches 190 within the periphery region 102, and further covers the bit lines 160 and the ILD 220. Subsequently, the metal conductive layer 230 is patterned to form a plurality of plugs 175, 195 disposed in the cell region 101 and the periphery region 102 respectively.

Figure 7:
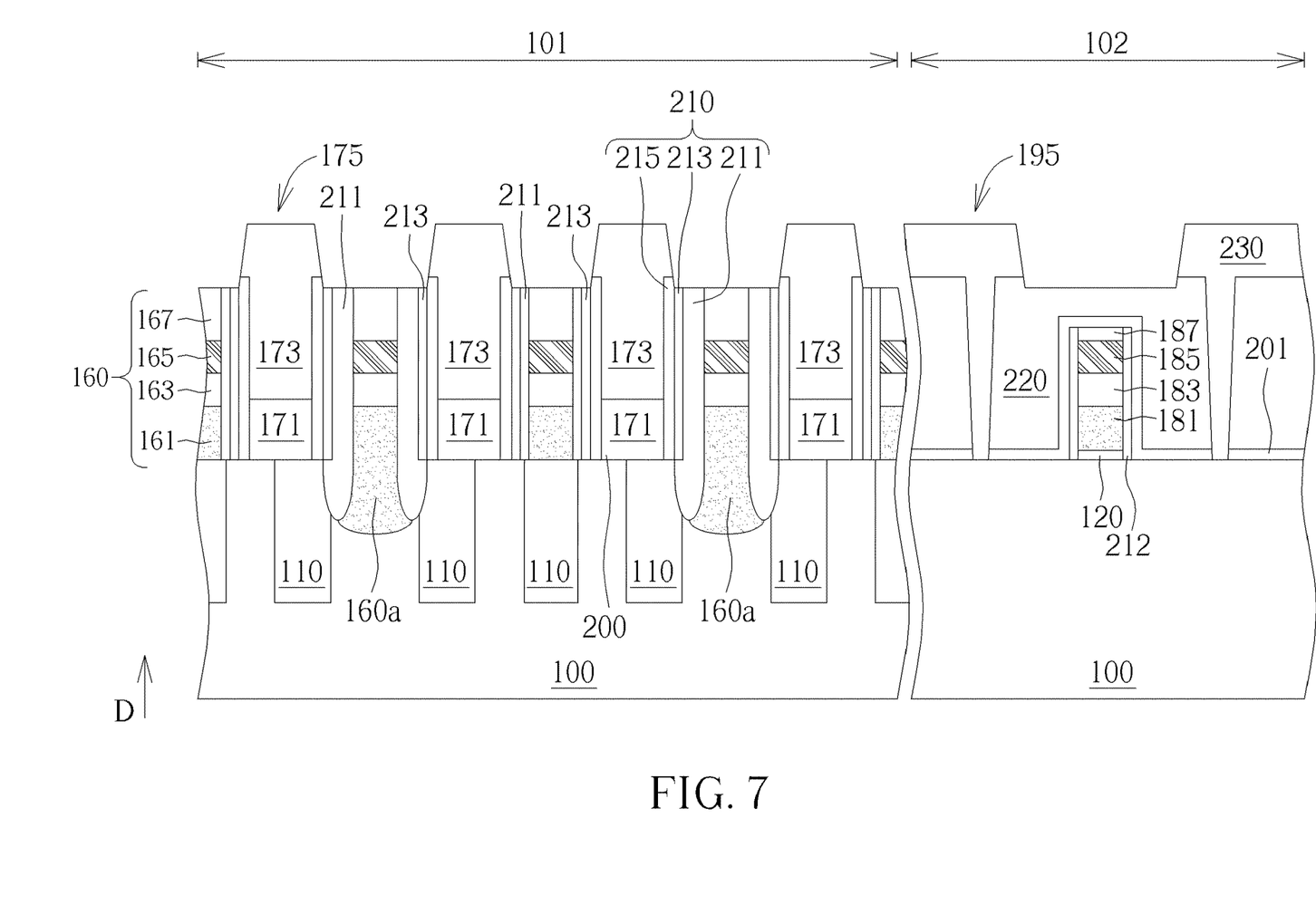
FIG. 7 shows a cross-sectional view of a semiconductor device after forming a plug.

Precisely speaking, a first etching process is performed, to form a plurality of openings (not shown in the drawings) extended along the direction D to expose the top surface of each bit line 160, and the first layer 211 and the second layer 213 of spacer at the two sides of each bit line 160. That is, the metal conductive layer 230 disposed on each bit line 160, and the first layer 211 and the second layer 213 of spacer, as well as the spacer material layer 200 underneath, are all completely removed, so as to form a third layer 215 of spacer covered on the second layer 213 of spacer. In this way, the third layer 215 of spacer has a top surface higher than that of the first layer 211 and the second layer 213 of spacer, as shown in FIG. 7, and the first layer 211, the second layer 213 and the third layer 215 of spacer may together form a composite spacer 210, with the second layer 213 of spacer being between the first layer 211 and the third layer 215 of spacer and having a different material (such as polysilicon) from others. On the other hand, since the spacer material layer 200 disposed in the periphery region 102 is namely covered on the gate structure 180, the spacer layer material 200 may not be exposed form those openings. That is, the spacer material layer 200 disposed in the periphery region 102 may not be etched in the first etching process, and which is remained on the gate structure 180 to form a spacer layer 201, as shown in FIG. 7.

Next, a second etching process is performed under the coverage of a mask layer (not shown in the drawings), with the mask layer including a plurality of mask patterns along a direction which is perpendicular to the direction D. Through the second etching process, the metal conductive layer 230 within the cell region 101 are further patterned to form the plugs 175, and the metal conductive layer 230 within the periphery region 102 are patterned to from the plugs 195, as shown in FIG. 7. In the present embodiment, the plugs 175 and the bit lines 160 are namely alternately arranged along a direction which is perpendicular to the direction D, and each of the plugs 175 is namely consisted of patterned metal conductive layer 230 and the conductive layer 171 underneath. In this way, each plug 175 may therefore function like a storage node (SNC) to electrically connect the substrate 100 at the two sides of each BWL. It is also noted that, each plug 175 includes an upper portion which is higher than the top surfaces of the bit lines 160, and each upper portion is configured to serve a conductive pad of each SNC, as shown in FIG. 7. On the other hand, each of the plugs 195 within the periphery region 102 only includes patterned metal conductive layer 230, and which is electrically connected to the source/drain regions of the gate structure 180.

Figure 8:
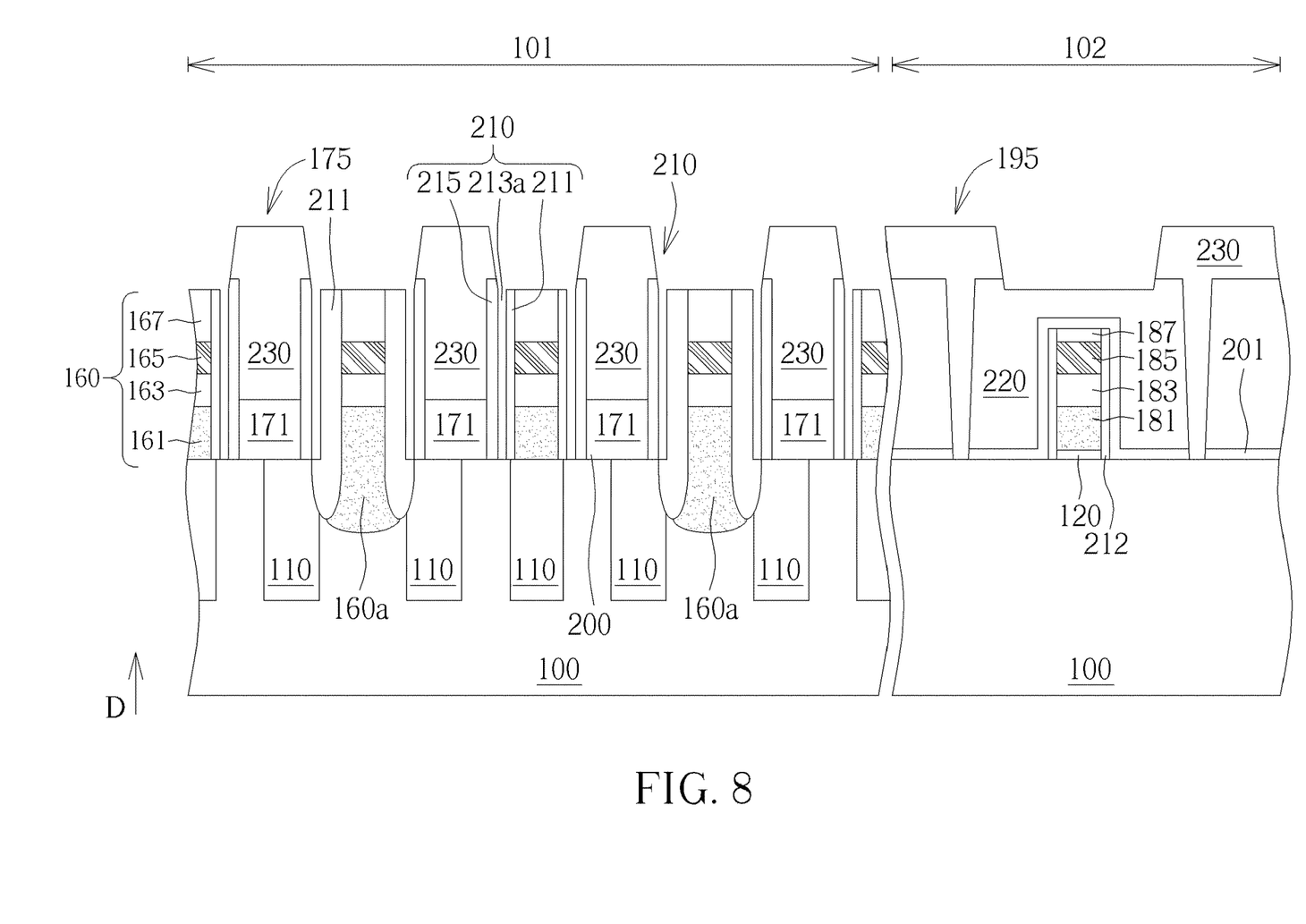
FIG. 8 shows a cross-sectional view of a semiconductor device after forming an air-gap layer.

Following these, another etching process is performed to completely remove the second layer 213 of spacer in each composite spacer 210. Precisely speaking, after patterning the metal conductive layer 230, the composite spacer 210 is therefore exposed, so that, the aforementioned another etching process is namely performed by using the patterned metal conductive layer 230 as a mask, and further using the etching selectivity between the two layers 211, 215 of spacer, to only remove the silicon-containing second layer 213 of spacer. That is, an air-gap layer 213*a* is formed thereby between the first layer 211 and the third layer 215 of spacer, within each composite spacer 210, as shown in FIG. 8.

Figure 9:
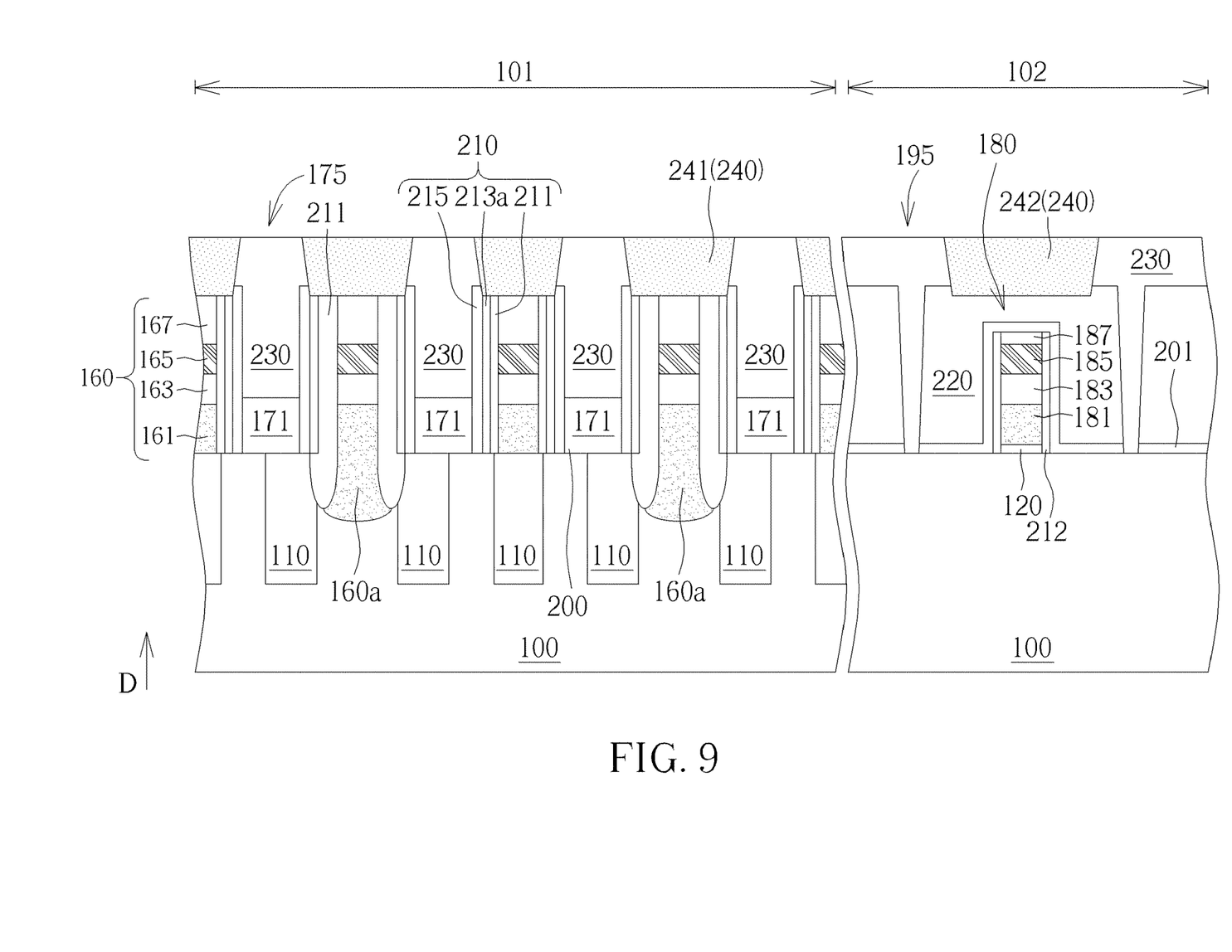
FIG. 9 shows a cross-sectional view of a semiconductor device after forming a capping layer.

Finally, a capping layer 240 is formed to cover the bit lines 160 and the composite spacer 210 within the cell region 101, and the gate structure 180 within the periphery region 102. In the present embodiment, the capping layer 240 for example includes a dielectric material having an etching selectivity related to that of ILD 220, such as silicon nitride, but is not limited thereto. The formation of the capping layer 240 for example includes entirely forming a capping material layer (not shown in the drawings), and performing a planarization process such as a CMP process to form the capping layer 240 leveled with the top surfaces of the plugs 175, 195. Precisely speaking, the capping layer 241 disposed within the cell region 101 covers and directly in contact with the top surfaces of each bit line 160 and each composite spacer 210, so that, the air-gap layer 213*a* is therefore embedded in the composite spacer 201 (the first layer 211 and the third layer 215) and the capping layer 241, as shown in FIG. 9. Furthermore, a portion of the capping layer 241 is namely disposed between each plug 175 to directly in contact the sidewalls thereof. On the other hand, the capping layer 242 disposed within the periphery region 102 is formed between the plugs 195, to directly in contact with the ILD 220 disposed below. That is, a portion of the ILD 220 is therefore between the gate structure 180 and the capping layer 242, to avoid the capping layer 242 directly contacting the gate structure 180 underneath, as shown in FIG. 9.

According to the above processes, a forming method of semiconductor device according to the preferred embodiment of the present invention is completed. In the present forming steps, the air-gap layer 213a is formed after the formations of SNCs and the conductive pad, by using the formed conductive pad as a mask and using the etching selectivity between each layer of the composite spacer. In other words, the air-gap layer 213a is formed by removing the only silicon-containing layer (namely the second layer 213 of spacer) in the composite spacer 210, so that, an addition etching mask is no longer needed for forming such air-gap layer 213a. Moreover, since the elements such as the gate structure 180 formed within the periphery region 102 may not be exposed while forming the air-gap layer 213a, the gate structure 180 and the ILD 220 disposed within the periphery region 102 will no longer be affected under the forming process of the air-gap layer 213a, and the material of ILD 220 is allowable to include a dielectric material having a lower dielectric constant. Thus, the air-gap layer 213a of the present embodiment is formed via a simplified and a cost-reduced process flow.

In overall speaking, the semiconductor device of the present invention is characterized by forming an air-gap layer after the formations of the SNCs and the conductive pads by directly using formed conductive pad as a mask. Also, since the air-gap layer is formed through removing the only silicon-containing middle layer within the composite spacer, the formation of the air-gap layer is therefore achieved in a simplified process flow without affecting other elements in other regions. Thus, the semiconductor device obtained in said forming method of the present invention not only can simplify the process flow thereof, but also can achieve better performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate having a cell region and a periphery region;
   forming a plurality of bit lines on the substrate within the cell region, and forming a composite spacer at two sides of each bit line, wherein each of the composite spacer comprises a middle silicon layer;
   forming a least one gate structure on the substrate within the periphery region;
   forming a dielectric layer, covered on the cell region and the periphery region;
   forming a plurality of plugs in the dielectric layer, within the cell region and the periphery region;
   removing the middle silicon layer of each composite spacer, to form an air-gap layer; and
   forming a capping layer, covered on the air-gap layer and the dielectric layer,
   wherein the capping layer is level with top surfaces of the plugs.

2. The method of forming a semiconductor device according to claim 1, wherein the capping layer directly contacts the plugs.

3. The method of forming a semiconductor device according to claim 2, the forming of the plugs further comprises:
   forming a plurality of first plugs in the dielectric layer, within the cell region; and
   forming a plurality of second plugs in the dielectric layer, within the periphery region.

4. The method of forming a semiconductor device according to claim 3, wherein the capping layer is formed between the second plugs, and a portion of the dielectric layer is disposed between the capping layer and the gate structure.

5. The method of forming a semiconductor device according to claim 3, wherein the second plugs are formed after the first plugs are formed.

6. The method of forming a semiconductor device according to claim 1, further comprising:
   forming a plurality of trenches in the dielectric layer;
   forming a conductive layer filled in the trenches; and
   patterning the conductive layer to form the plugs.

7. The method of forming a semiconductor device according to claim 1, wherein the dielectric layer comprises an etching selectivity related to the middle silicon layer.

8. The method of forming a semiconductor device according to claim 1, further comprising:
   forming a first layer at the two sides of each bit line;
   forming the middle silicon layer on the first layer; and
   forming a third layer on the middle silicon layer, and the first layer and the third layer comprising a material which is different from the middle silicon layer.

9. The method of forming a semiconductor device according to claim 8, wherein the forming of the third layer comprises:
   forming a material layer covered on the middle silicon layer, the first layer, the bit lines and the gate structure; and
   performing an etching process to form the third layer in the cell region, and to form a spacer layer covered on the gate structure in the periphery region.

* * * * *